(12) United States Patent
Ho et al.

(10) Patent No.: US 6,503,770 B1
(45) Date of Patent: Jan. 7, 2003

(54) SELF-ALIGNED FABRICATION METHOD FOR RIDGE-WAVEGUIDE SEMICONDUCTOR LASER

(75) Inventors: Chong-Long Ho, Taoyuan (TW); Chia-Ju Lin, Taoyuan (TW); Wen-Jeng Ho, Taoyuan (TW); Jy-Wang Liaw, Taoyuan (TW)

(73) Assignee: Chunghwa Telecom Co., Ltd., Taoyuan (TW)

( * ) Notice: Subject to any disclaimer, the term of this patent is extended or adjusted under 35 U.S.C. 154(b) by 0 days.

(21) Appl. No.: 10/139,346

(22) Filed: May 7, 2002

(51) Int. Cl.[7] ............................................... H01L 21/00
(52) U.S. Cl. ........................................... 438/22; 438/42
(58) Field of Search ........................ 438/22–25, 29–32, 438/42, 43–44, 689–693, 700–702

(56) References Cited

U.S. PATENT DOCUMENTS

| 4,830,986 A | 5/1989 | Plumb |
| 5,059,552 A | 10/1991 | Harder et al. |
| 5,208,183 A | 5/1993 | Chen et al. |
| 5,474,954 A | 12/1995 | Yang |
| 5,504,768 A | 4/1996 | Park et al. |
| 5,658,823 A | 8/1997 | Yang |
| 5,805,755 A | * 9/1998 | Amersfoort et al. ........... 372/48 |
| 6,171,876 B1 | * 1/2001 | Yuang et al. .................. 438/22 |
| 6,335,215 B1 | * 1/2002 | Yuang .......................... 438/22 |

* cited by examiner

Primary Examiner—Chandra Chaudhari
Assistant Examiner—Craig Thompson
(74) Attorney, Agent, or Firm—Rabin & Berdo, P.C.

(57) ABSTRACT

A self-aligned fabrication method utilizes dielectric planarization process for fabricating ridge waveguide semiconductor lasers. The dielectric planarization process starts with depositing a thick dielectric film onto the ridge-structured semiconductor wafer surface, and then the resulting corrugated dielectric surface is polished into a flat surface in a self-terminated manner. This dielectric flat surface is able to uniformly expose its semiconductor ridge tops by an overall etch-back process.

8 Claims, 17 Drawing Sheets

SELF-ALIGNED FABRICATION METHOD FOR RIDGE-WAVEGUIDE SEMICONDUCTOR LASER

BACKGROUND OF THE INVENTION

1. Field of the invention

The present invention relates to the fabrication of a semiconductor laser, and in particular, a self-aligned fabrication method for ridge-waveguide semiconductor laser.

2. Description of the Prior Art

Referring to FIG. 1A and FIG. 1B, in which two conventional structures of a ridge-waveguide semiconductor laser are shown. Both the epitaxial structures consist of a semiconductor substrate 100(such as N-type semiconductor substrate), a first semiconductor waveguide layer 101, a first semiconductor confinement layer 102, a semiconductor active layer region 103, a second semiconductor confinement layer 104, a second semiconductor waveguide layer 105, and a semiconductor ohmic contact layer 106. And, a dielectric passivation layer 107a or 107b, a P-type metal electrode 108a or 108b, and a N-type metal electrode 109 are comprised in both structures.

The fabrication of both structures starts with pattern definition through standard photolithography process, followed by an etching process such as reactive-ion etching (RIE) to form a semiconductor ridge along with a double trench structure 110 shown in FIGS. 1A and 1B. The dielectric layer 107a or 107b is then deposited on the entire wafer surface to provide semiconductor surface passivation. After a contact window on the ridge top is formed to expose the ohmic contact layer 106, the P-type metal electrode 108a or 108b is formed so as to make contact with the semiconductor contact layer 106. Finally, the N-type metal electrode 109 is formed underneath the wafer after the wafer has been lapped and polished.

To reduce the threshold current for lasing action and to maintain single-transverse mode operation, the ridge width W is usually limited to about 2 $\mu$m. Such a narrow ridge causes problems when a contact window is to be opened on top of it to expose the ohmic contact layer 106. The most direct way is to define the contact window 106 on the ridge top through mask alignment and photolithography process as shown in FIG. 1A. However, the defined contact window should be narrower, a rather accurate mask alignment is required. Besides, even by doing so, the aim of perfect utilization of the ohmic contact layer 106 is hard to attain resulting in an non-optimized contact between metal and semiconductor.

In view of the above description, it emerges a fact that the semiconductor laser fabricated according to conventional techniques has by no means an acceptable quality.

A number of alternative methods were proposed to expose the semiconductor contact layer of the ridge top more conveniently and to fully utilize the ridge top for metal contact, such as U.S. Pat. No. 4,830,986, U.S. Pat. No. 5,059,552, U.S. Pat. No. 5,208,183, U.S. Pat. No. 5,474,954, U.S. Pat. No. 5,504,768, U.S. Pat. No. 5,258,823, and U.S. Pat. No. 6,171,876. In U.S. Pat. No. 5,504,768, a P-type metal stripe defining a semiconductor ridge structure region was deposited onto the wafer surface at the beginning of the process and then served as the mask for semiconductor ridge etching, therefore ensured that the ridge top was fully contacted. However, in the successive process, a stringent mask-aligning process is required for overlaying metal to precisely connect the P-type metal stripe and the bondpad.

In other patented cases, a self-alignment concept was introduced and methods for implementing this concept can be classified into two categories, and both will lead to a typical device structure depicted in FIG. 1B, in which the whole ridge top is fully utilized for metal contact. In the first kind, such as in U.S. Pat. No. 4,830,986 and U.S. Pat. No. 5,059,552, a photoresist mask was used to define and form a semiconductor ridge. This photoresist mask on the ridge top was preserved until the entire wafer surface was covered with an insulating dielectric film, such as silicon oxide (SiOx) or silicon nitride (SiNx). Then the photoresist mask was chemically removed by (acetone, for instance) and the ohmic contact layer on the ridge top was revealed without exposing other semiconductor surfaces out of the dielectric film. This scheme is called "self-alignment" by reason that exposing of the ohmic contact layer does not require processes of mask aligning and photolithography. Although such a scheme can attain the aims of simplifying the fabricating process and full utilization of the ohmic contact layer. Preservation of the photoresist mask necessitates low temperature (100° C.) dielectric layer deposition which causes degradation of the quality of the dielectric layer. Besides, a suitable undercut profile of the semiconductor top ridge is required to facilitate photoresist mask's removal after deposition of the dielectric layer, and this complicates the process.

In the second kind, such as U.S. Pat. No. 5,208,183, U.S. Pat. No. 5,474,954, U.S. Pat. No. 5,658,823, and U.S. Pat. No. 6,171,876, the planarization capability of the photoresist or polyimide was utilized. As photoresist or polyimide is spun onto the ridge structured wafer surface, the flowing nature results in a profile that has a much thinner resist or polyimide on the ridge top than on the rest of the wafer surface. By overall etch-back process, such as RIE, the semiconductor ridge top can be revealed at first without exposing other semiconductor surfaces. Therefore the entire ridge top can be fully utilized for metal contact. The difference between using photoresist and polyimide is that after exposing the ridge top, the polyimide layer is left on the wafer surface and serves as a dielectric planarization layer. The P-metal with its bondpad is then directly formed thereon. Therefore using the polyimide will be a more straightforward method. Besides, a single-ridge structure can be adopted for forming the ridge-waveguide semiconductor laser by planarization of the polyimide. By so the metal coverage problem usually encountered in double-trench structure can be avoided.

However, the polyimide film, even cured, still retains flexible property. During facet cleavage process, elongated polyimide film in the edge might interfere with the laser output surface and affect the structural property and uniformity.

Aiming at the above depicted defects, the present invention is to propose a newly developed self-aligned fabrication method for ridge-waveguide semiconductor laser capable of eliminating existing defects.

SUMMARY OF THE INVENTION

The present invention teaches a self-aligned fabrication method for ridge-waveguide semiconductor laser. This method can be applied by performing what is called "self-terminated oxide polish, abbreviated as STOP" technique followed by deposition of a thick oxide layer. Taking SiOx for example, this thick oxide layer (thicker than the ridge height) covers the entire wafer surface. The oxide corrugations due to deposition on the ridge-structured wafer surface are then polished down to a flat plane. The polishing process removes the narrow oxide ridge (narrower than 10 μm for instance) rapidly, while almost halts when the oxide surface is flattened. Such behavior finally results in a rather flat oxide plane. The planarity therefore depends on the oxide deposition mechanism rather than on the polishing process.

For achieving the object of the self-aligned fabrication method for ridge-waveguide semiconductor laser described above. The present invention utilizes a process of planarizing a dielectric layer in which a dielectric layer of sufficient thickness is covered over a ridge-structured semiconductor wafer surface, the oxide corrugations formed on the surface of the dielectric layer is then polished down to a flat plane by the STOP technique, and followed by over-all etch-back process for this planar dielectric layer, the ridge tops of the semiconductor laser can be exposed uniformly.

BRIEF DESCRIPTION OF THE DRAWINGS

The present invention and its advantages can better be understood by describing in detail the preferred embodiments thereof with reference to the attached drawings in which.

DETAILED DESCRIPTION OF THE PREFERRED EMBODIMENT

The invention provides a self-aligned fabrication method for ridge-waveguide semiconductor laser. More particularly, this self-aligned method utilizes STOP technique so as to planarize the ridge-structured oxide surface. The deposition of a SiOx layer by plasma enhanced chemical vapor deposition (PECVD) process will be taken as an example for description of the present invention hereinafter.

The application of STOP technique starts with deposition of a sufficiently thick dielectric layer. SiOx layer by PECVD for instance. onto the entire ridge-structured wafer surface. To obtain a flat, whole SiOx surface after polishing process, the SiOx thickness must be higher than the ridge height. Due to conformal deposition nature of PECVD, the ridge-structured wafer surface transfers its topography over the SiOx layer and results in a corrugated oxide surface. By conventional polishing process, the corrugated oxide surface will be polished down to a flat plane, that is, planarized. A key point in avoiding non-uniformity or over polishing is to adjust the applied load to a proper value. Hence, the polishing process removes the thickness of the narrow oxide ridge (narrower than 10 μm for instance) rapidly, while almost halts when a wide oxide surface (wider than 300 μm for instance) is reached. Such discriminated polishing behavior due to area difference results in a rather flat SiOx plane that makes it possible to form a considerably flat SiOx surface, and at the same time, the polishing behavior is almost halted as if it is self-terminated. This is the reason why it is called STOP. Subsequently, overall oxide etch-back to expose the uniform semiconductor ridge tops is carried out. A considerably flat wafer surface can be obtained by RIE during overall oxide etch-back process, and an equally leveled SiOx layer will appear along the circumference of exposed semiconductor ridge tops. In the following, two preferred embodiments are presented for introducing in detail the fabrication of the ridge-waveguide semiconductor laser by means of this self-aligned method.

Figure 1A:
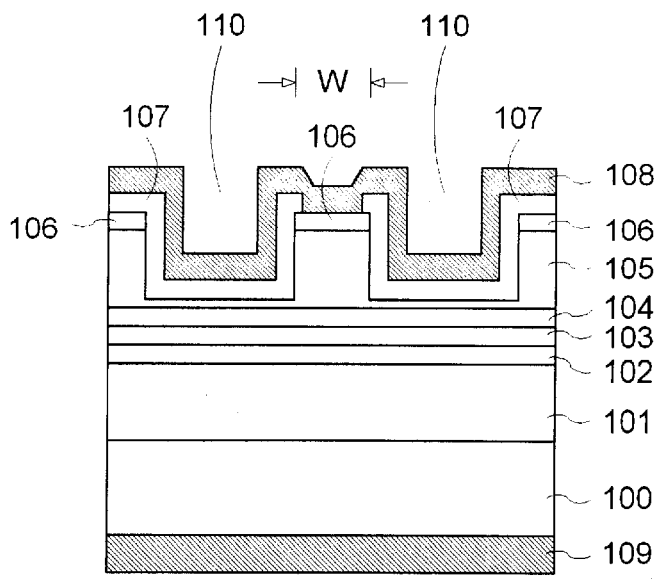
FIG. 1A is a cross sectional view showing a conventional double-trench ridge-waveguide semiconductor laser.
Figure 1B:
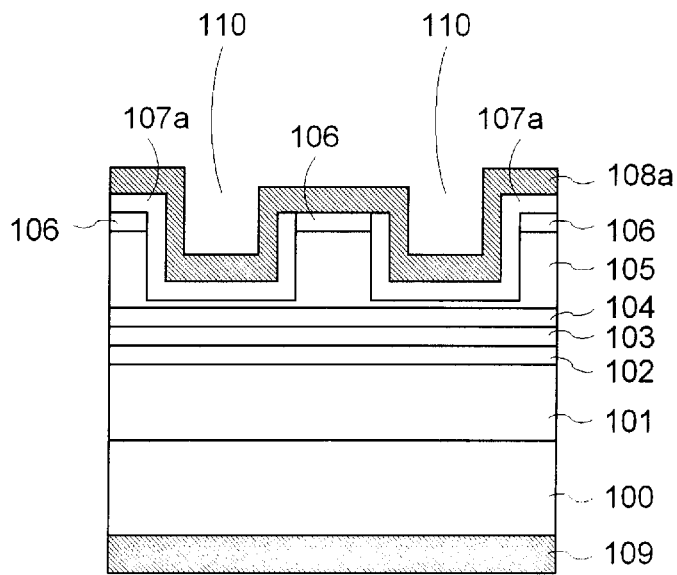
FIG. 1B is a cross sectional view showing a conventional double-trench ridge-waveguide semiconductor laser fabricated by prior self-alignment techniques.
Figure 2A:
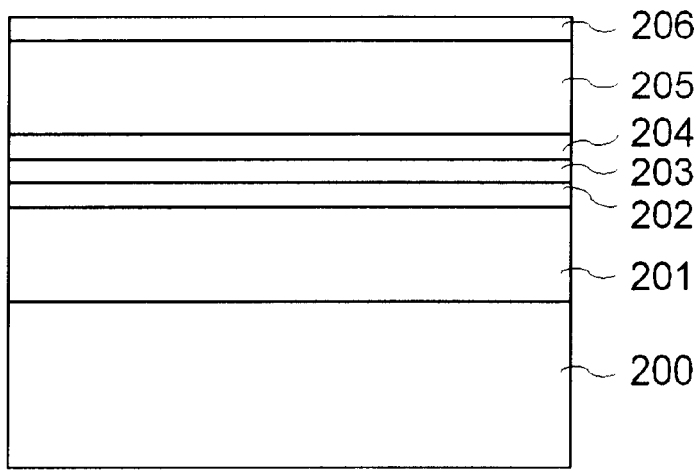
FIGS. 2A through 2N are cross sectional view of a ridge-waveguide semiconductor laser fabricated by the self-alignment technique in a first embodiment of the present invention.
Figure 2B:
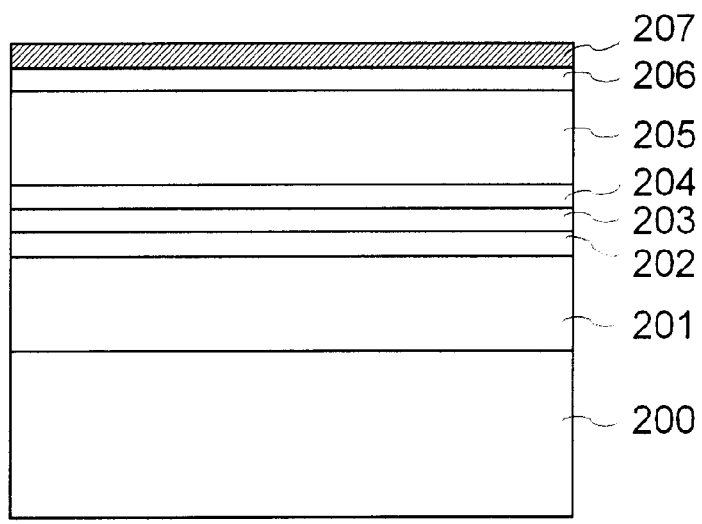
Figure 2C:
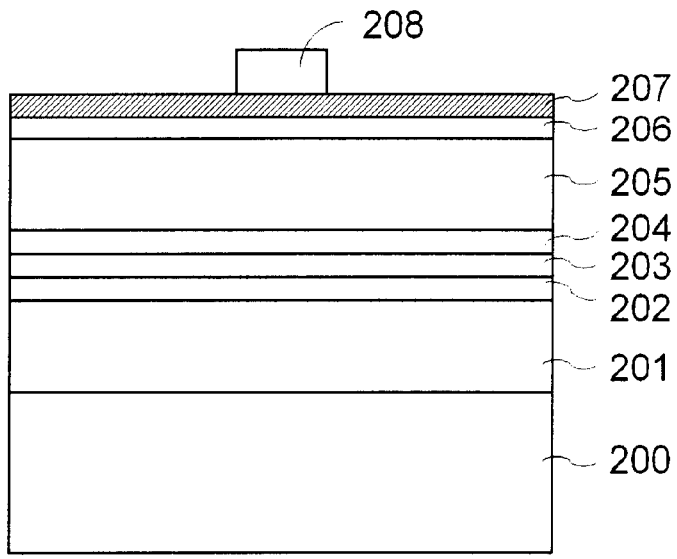
Figure 2D:
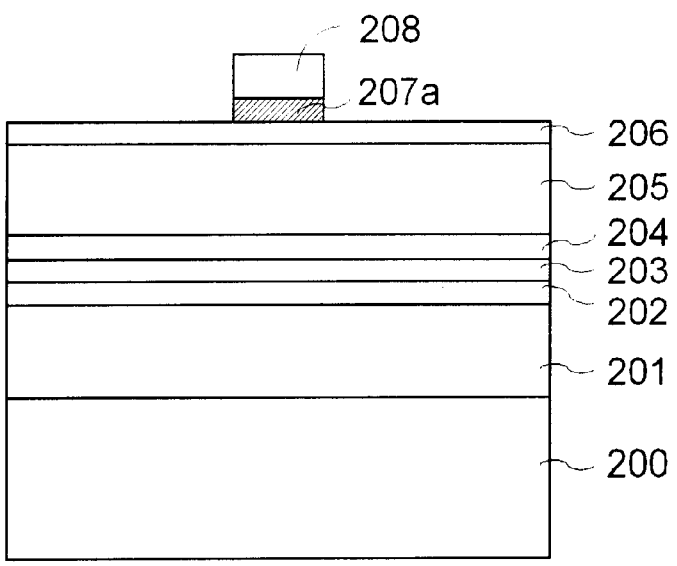
Figure 2E:
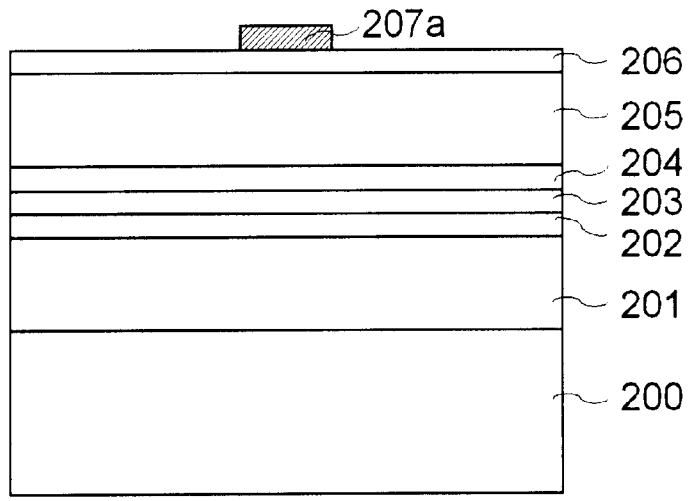
Figure 2F:
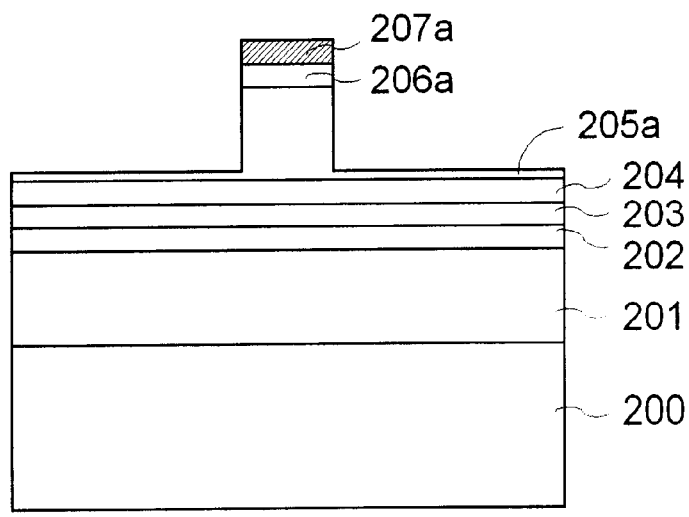
Figure 2G:
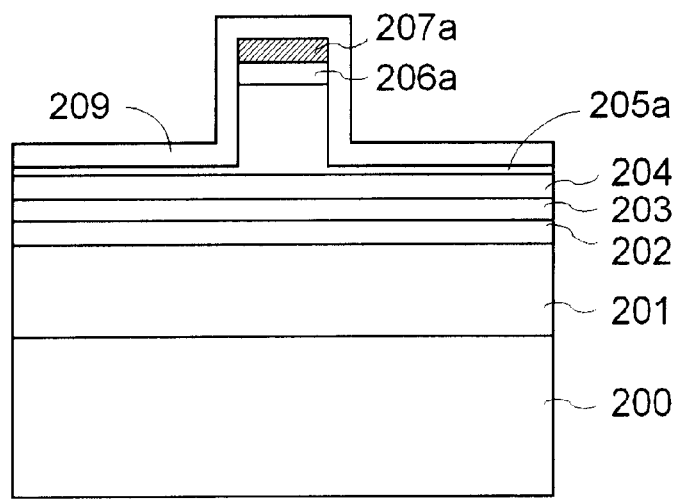
Figure 2H:
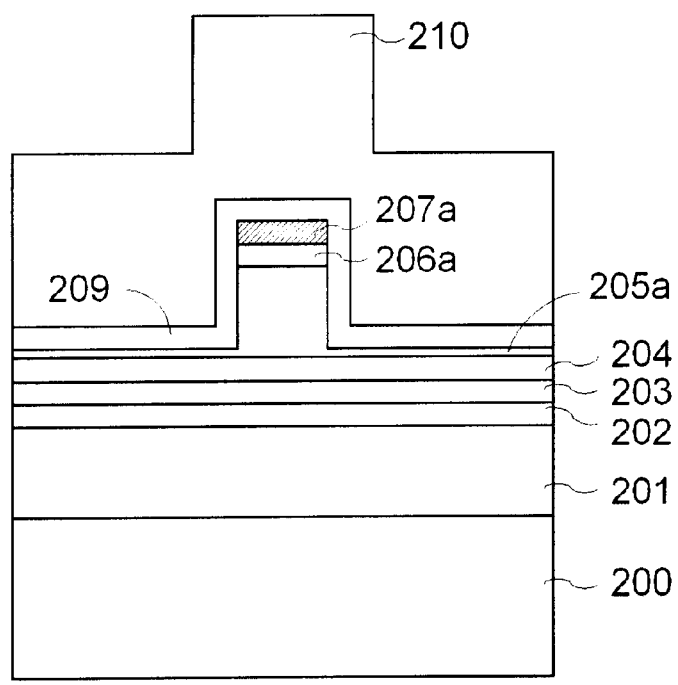
Figure 2I:
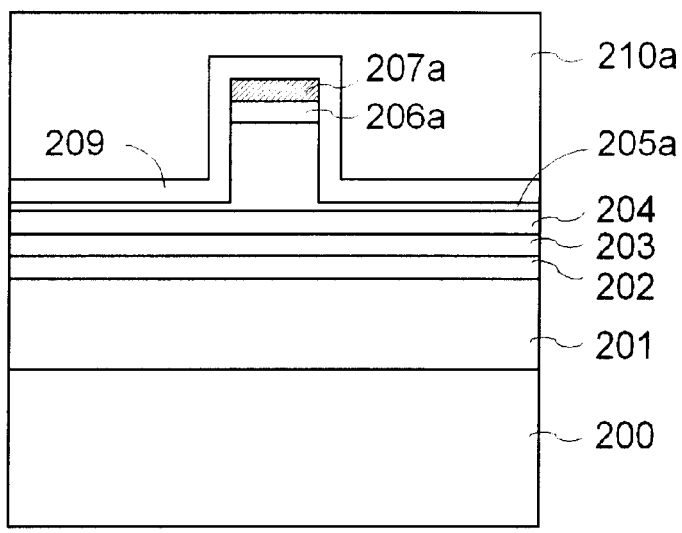
Figure 2J:
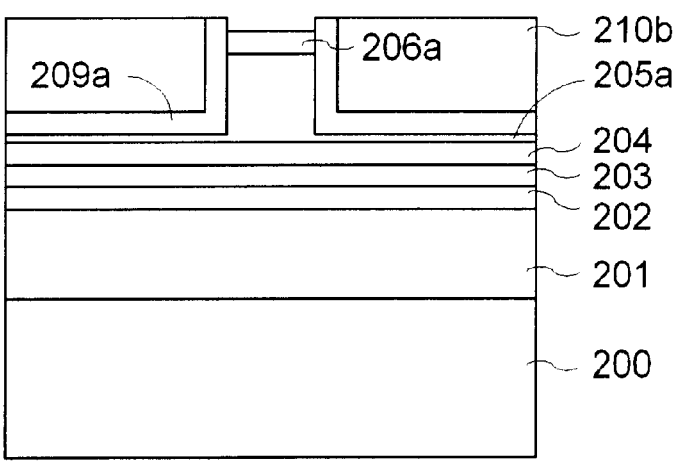
Figure 2K:
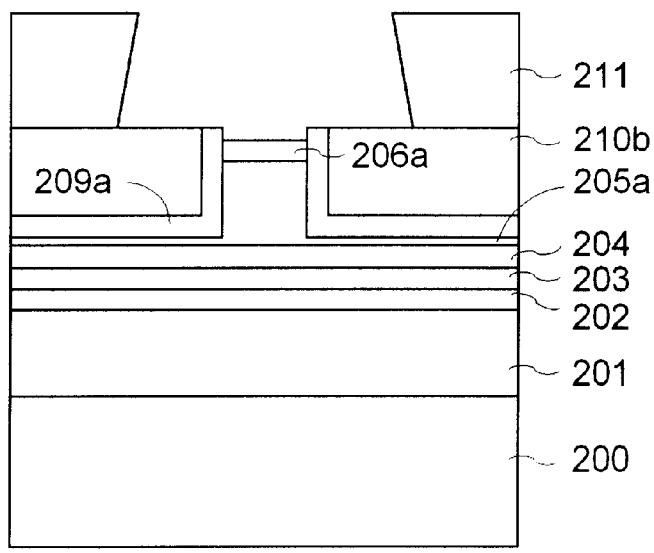
Figure 2L:
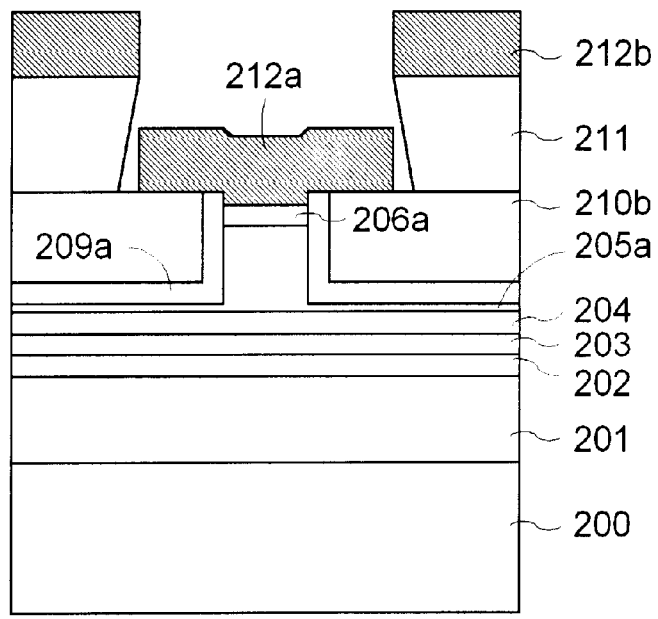
Figure 2M:
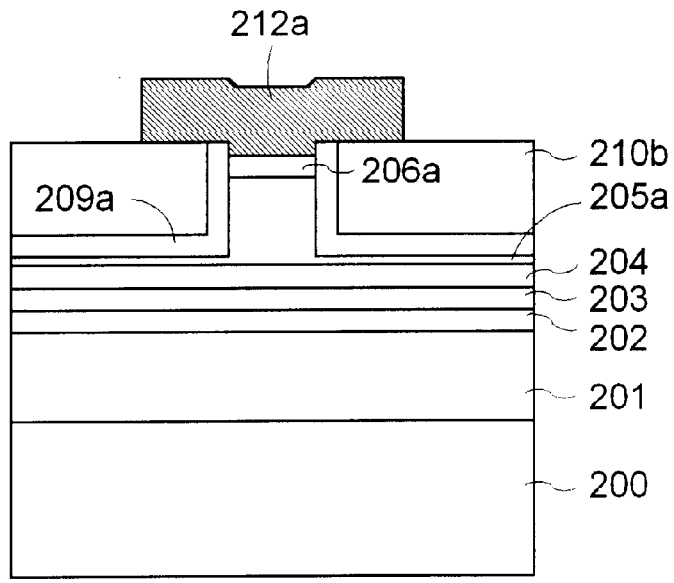
Figure 2N:
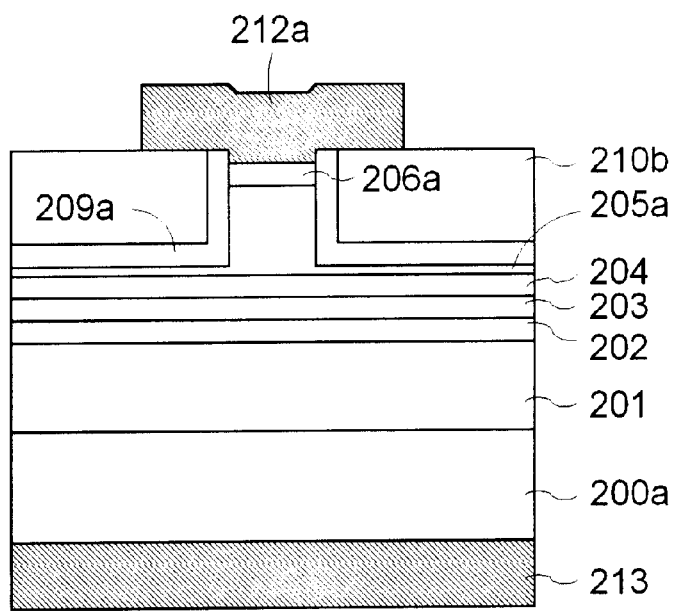

In the first embodiment, the cross sectional views of the semiconductor laser in process are schematically shown from FIG. 2A to FIG. 2N. FIG. 2A shows an epitaxial structure of the semiconductor laser based on an N-type indium phosphide (InP) substrate 200 comprising (from top to bottom): an N-type InP waveguide layer 201. an N-type indium aluminum arsenide (In0.52Al0.48As) confinement layer 202, an active region 203 containing multiple quantum wells (MQWs), a second In0.52Al0.48As confinement layer 204, a 1.5 μP-type InP waveguide layer 205, and a 0.2 μm high concentration P-type In0.53Ga0.47As contact layer 206. The process starts with 2000 Å SiNx layer 207 deposition by PECVD at 250° C., on the wafer surface, as shown in FIG. 2B. Through conventional mask aligning photolithography process, a 2 μm-wide photoresist pattern 208 (FIG. 2C) is defined and serves as the etching mask for subsequent etching process. The SiNx layer not underneath the resist mask is then removed by RIE using $CF_4$ gas as shown in FIG. 2D. After resist mask 208 removal, the device structure is as shown in FIG. 2E. and the original 2 μm wide photoresist pattern is now transferred to a SiNx layer 207a. After wafer surface cleaning and deoxidization, the sample is loaded into the RIE process chamber. Using the patterned SiNx layer as an etching mask, and using 1 $CH_4$: 5$H_2$ gas mixture, the semiconductor layer not underneath the SiNx mask is etched to a depth of about 1.6~1.7 μm so as to form a semiconductor ridge structure as shown in FIG. 2F. The etched layers include the whole In0.53Ga0.47As contact layer 206 and a part of the P-type InP waveguide layer 205. To obtain a well etched profile (i.e., a nearly vertical ridge edge and mirror like wafer surface), the etching process needs to be interrupted for removing polymers and carbonized byproducts generated during the etching process by using $O_2$ and Ar gas mixture. After a semiconductor ridge structure is etched out, and wafer surface cleaning and de-oxidation process is accomplished, a 3000 Å SiNx passivation layer 209 is deposited on the entire wafer surface by PECVD at 250° C., as shown in FIG. 2G.

To this stage, the device is fabricated through well-known semiconductor process. In the following, a self-aligned process by STOP technique that is the key point of this invention will be utilized.

After surface passivation by SiOx deposition, the wafer is transferred into another PECVD chamber, which allows for rapid SiOx deposition (2750 Å/min) at 350° C. After 3 μm thick SiOx layer 210 deposition, as shown in FIG. 2H, the thick SiOx layer covers the entire wafer surface and forms oxide ridges which stem from the semiconductor ridges. By conventional polishing process, which has adjustable loading ability of for example, 0 to 1.5 kg, an suitable load is exerted on the polished surface. The applied load has certain relation with the polished area. In the present embodiment the exerted pressure is about 0.1 kg/cm$^2$. An oxide layer 210a is planarized as shown in FIG. 2I. Unlike in the silicon VLSI industry which requires rather precise polishing tools for planarization (e.g. chemical mechanical polish, CMP), the equipment required by this invention can be those typically used for wafer backside lapping and polishing. With proper pressure exerting on the polished surface, those narrow SiOx ridges can be polished down rapidly while larger SiOx surface keeps almost unaltered. After all the SiOx ridges are planarized, simultaneously or sequentially, the polishing process almost halts as if self terminated and a flat and broad SiOx plane as shown in FIG. 2I is obtained. Then RIE process using $CF_4$ gas is utilized for overall etch-back to expose the top of In0.53Ga0.47As contact layer uniformly. Due to lower etching rate for SiOx (about 3000 Å/min) than for SiNx (about 1000 Å/min) carried out in this embodiment, the revealed top of a P-type IN0.53Ga0.47As contact layer 206a will be lower than the surrounding SiOx 210b by about 1000 Å as shown in FIG. 2J. Such scheme allows fully utilization of the semiconductor ridge top for metal contact, while provides larger tolerance for excessive etching.

Following conventional processes are not directly related to this invention and are well-known in semiconductor industries. Nevertheless, the resulting planar device structure derived from the aforementioned STOP polishing technique and overall etch-back process are helpful to the following processes and increase the processing yield.

After uniform exposure of the IN0.53Ga0.47As contact layer tops, conventional mask photolithography process is utilized to define the P-metal region, as illustrated in FIG. 2K. Note that an inverse-tapered photoresist profile 211 is necessary for the following metal lift-off process. 500 Å Ti, 500 Å Pt, and 4000 Å Au are deposited onto the wafer surface successively, as shown in FIG. 2L. After metal lift-off in acetone, which dissolves the photoresist pattern 211 and removes a metal 212b adhering thereon, a metal 212a in contact with the exposed IN0.53Ga0.47As layer is left as the P-metal electrode, as shown in FIG. 2M. It should be emphasized again that the planar structure obtained by the STOP polishing technique and the overall etch-back process is ideal for forming such P-type metal. On the contrary, conventional double trench structure might cause metal coverage and metal lift-off problems. After 20 sec. rapid thermal annealing (RTA) at 420° C. in nitrogen gaseous ambience, for P-metal contact annealing, wafer backside is lapped and polished until the thickness of wafer 200a remains about 100 µm, and a 1000 Å AuGeNi alloy (84% Au, 12% Ge, 4% Ni) and a 4000 Å Au are deposited onto the polished backside serving as a N-metal electrode 213, as shown in FIG. 2N. Finally another 20-sec RTA at 390° C. is performed for N-metal contact annealing. Both RTA processes are to reduce the ohmic contact resistance.

Figure 3A:
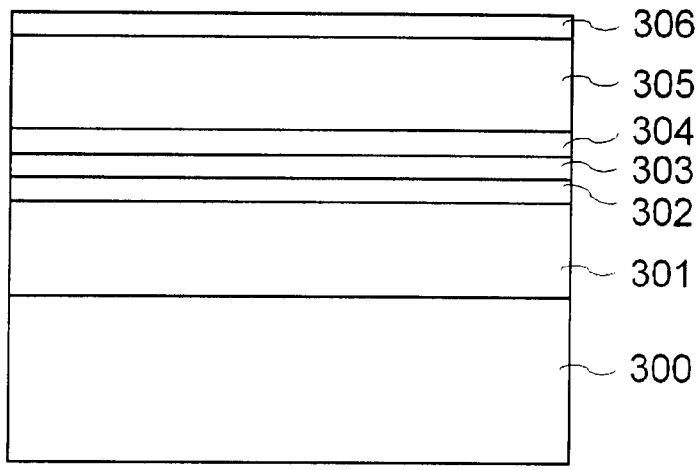
FIGS. 3A through 3P are cross sectional views of a ridge-waveguide semiconductor laser fabricated by the self-alignment technique in a second embodiment of the present invention.
Figure 3B:
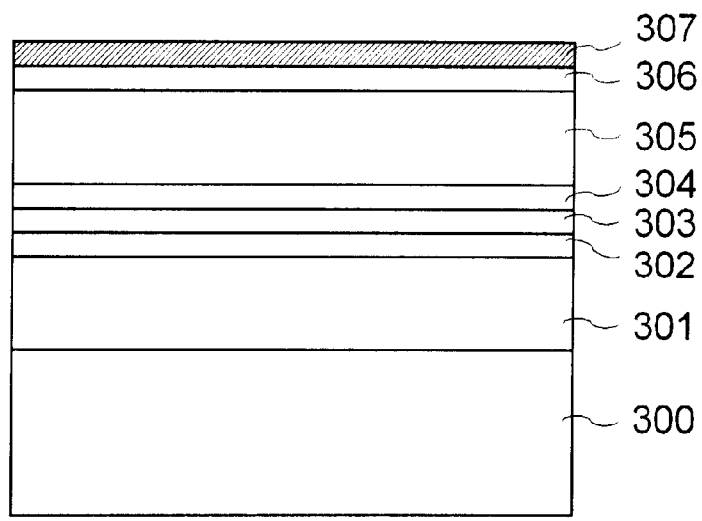
Figure 3C:
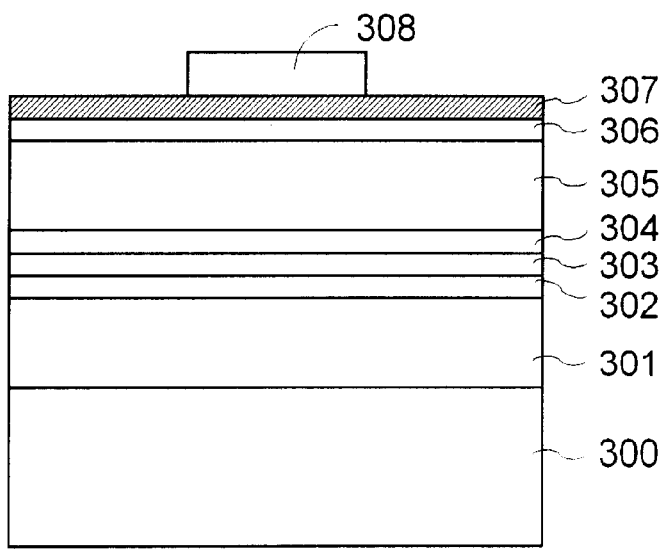
Figure 3D:
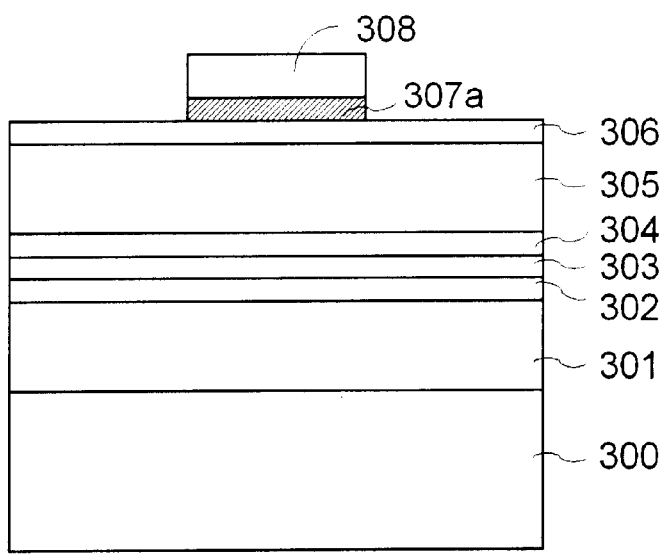
Figure 3E:
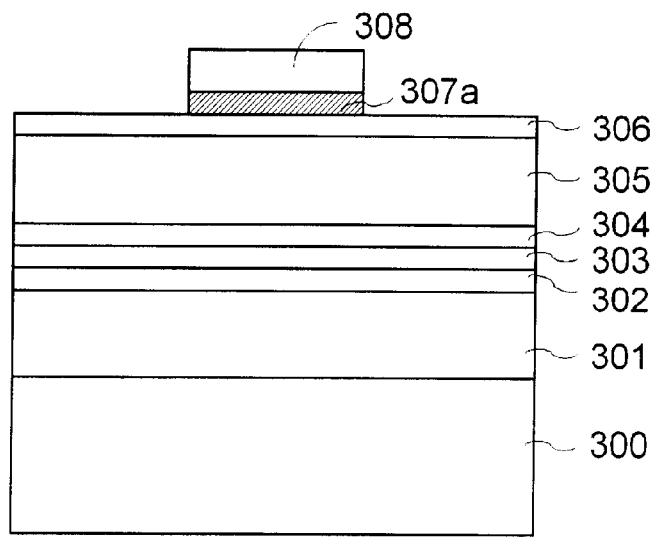
Figure 3F:
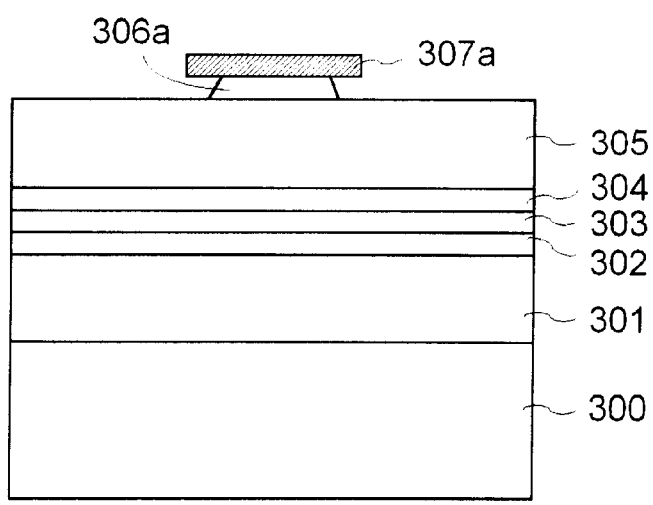
Figure 3G:
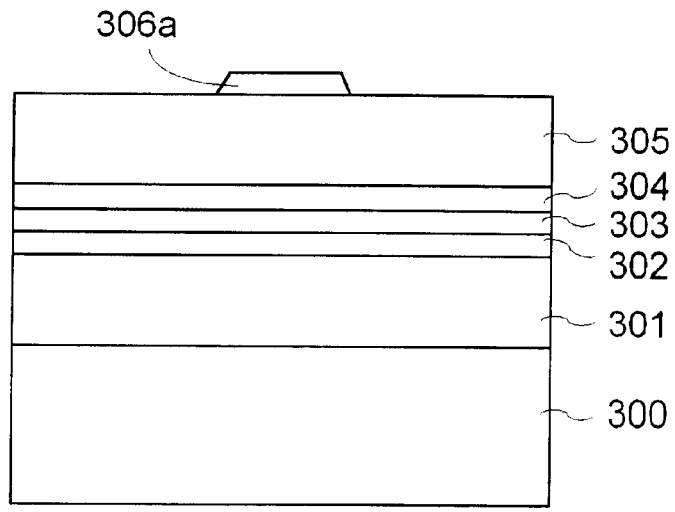
Figure 3H:
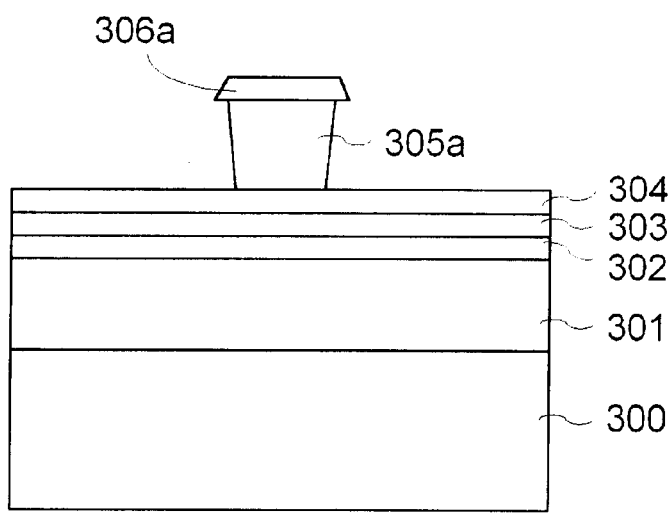
Figure 3I:
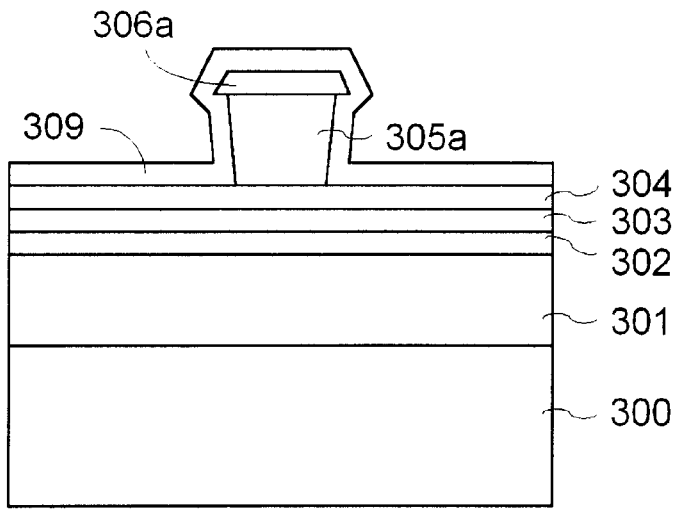
Figure 3J:
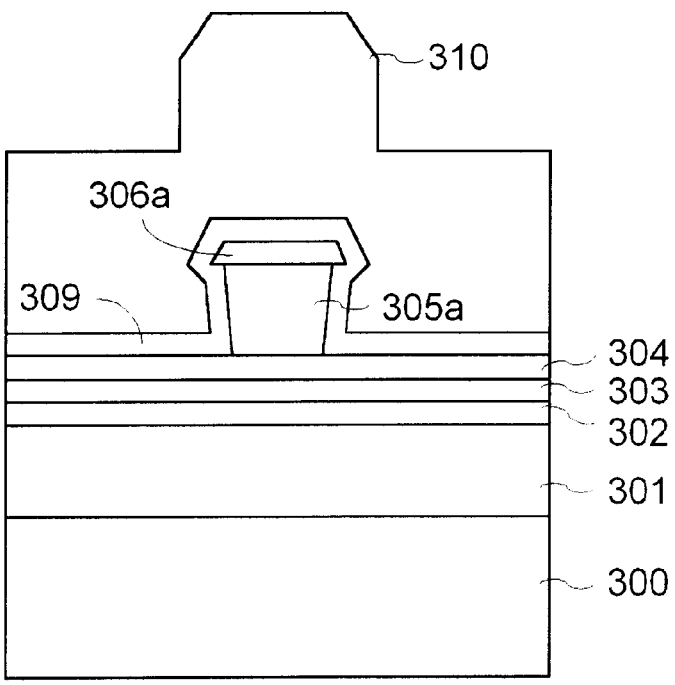
Figure 3K:
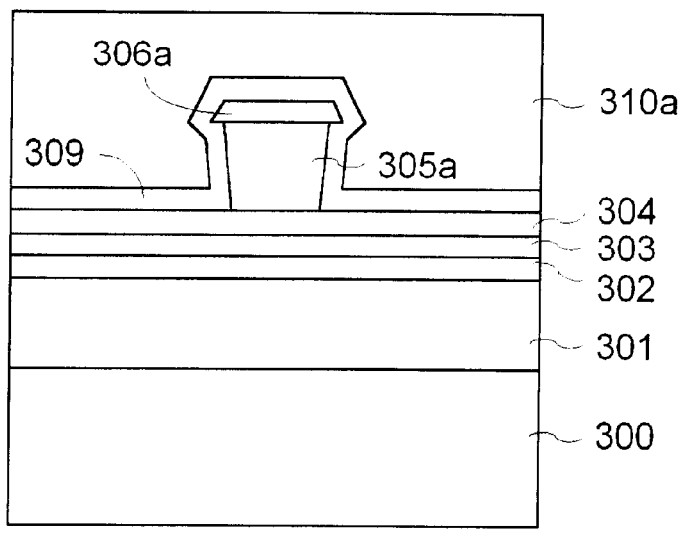
Figure 3L:
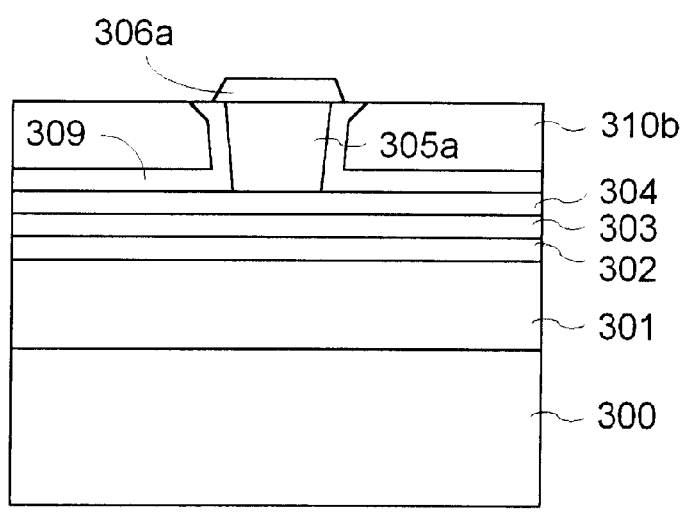
Figure 3M:
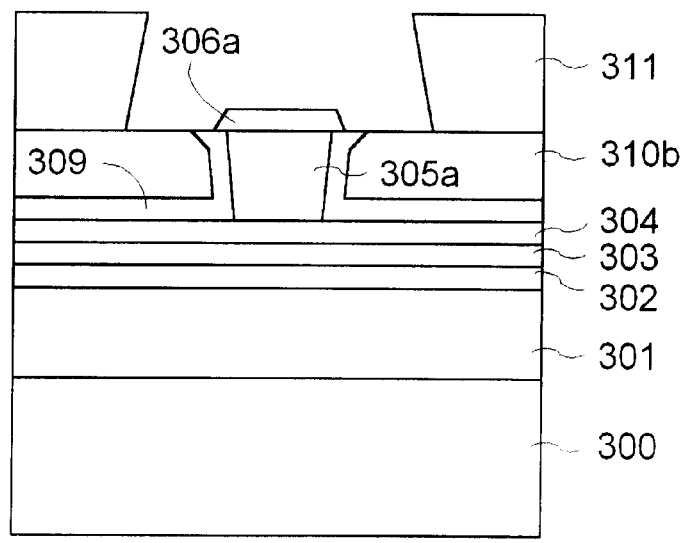
Figure 3N:
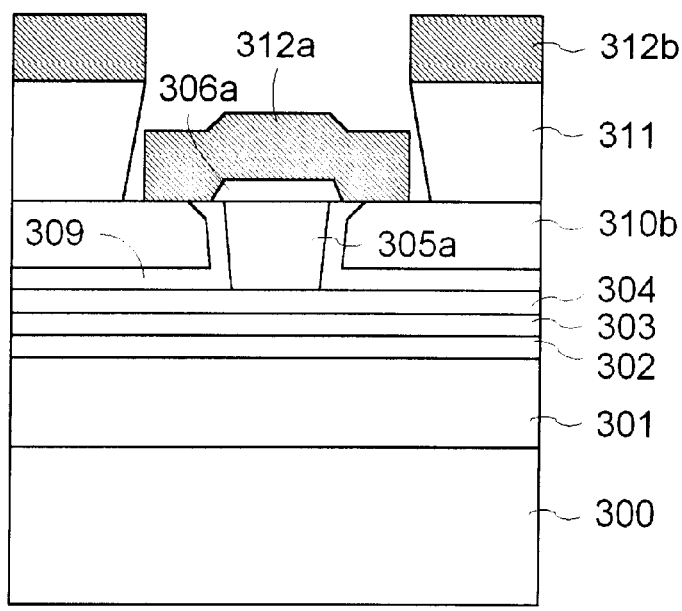
Figure 3O:
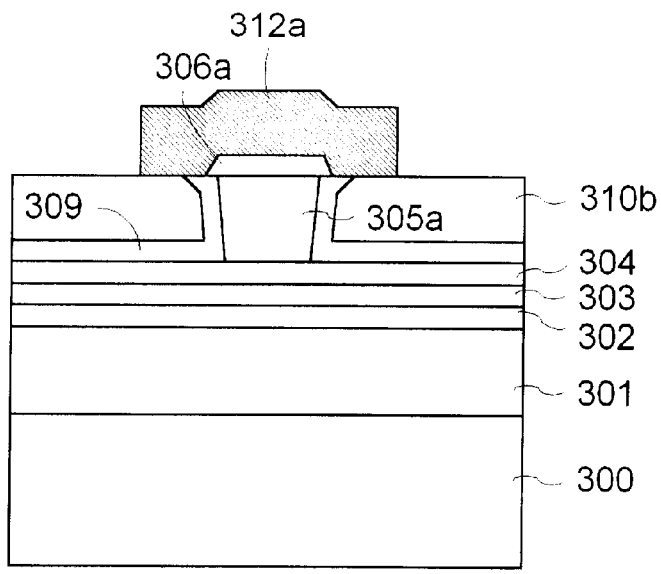
Figure 3P:
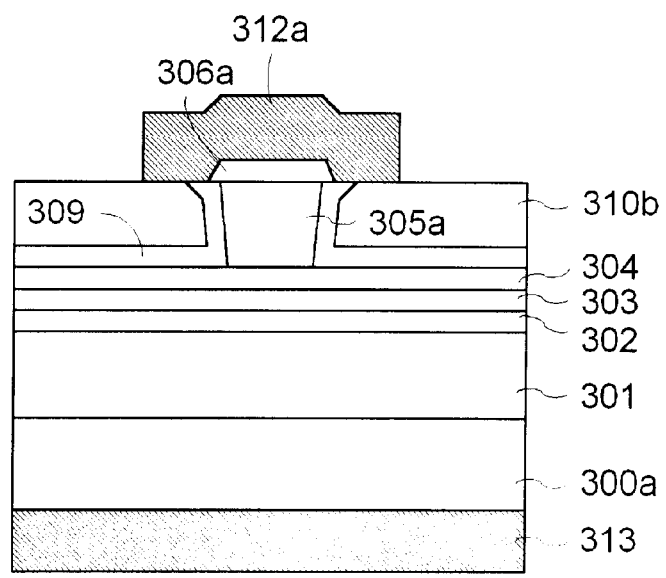

The second embodiment is described with the aid of the schematic cross sectional views of the semiconductor laser shown in FIGS. 3A through 3P. This embodiment is different from the previous one in that the laser ridge is formed by chemical wet etch instead of dry etch carried out in the first embodiment. Wet etch process has the advantages over dry etch process in that it is more simple and time-saving. Besides, wet etch can result in an undercut profile that has a wider contact area (about 4 µm) on the ridge top contact surface while preserve the required width of a narrower ridge-bottom (about 2 µm) for current injection, therefore reducing the contact resistance without generating unwanted transverse modes or increasing the threshold current. A conventional double-trench structure requires the P-metal to cover from the ridge top to the trench bottom, and if wet etch process is utilized for ridge formation, undercut or inverse tapered profile might cause a high resistance or disconnected circuit. In addition, too narrow trenches might cause non-uniform etching. On the contrary, in the present invention, devices starting from single ridge and ending with planarized wafer surface are free from these problems. Therefore full potential of wet etch as mentioned above can be exploited.

FIG. 3A shows the epitaxial structure of the semiconductor laser based on an N-type InP substrate 300 comprising (from bottom to top): an N-type InP waveguide layer 301, an N-type In0.52Al0.48As confinement layer 302, an active region 303 containing multiple quantum wells, a second In0.52Al0.48As confinement layer 304, a 1.5 µm thick P-type InP waveguide layer 305, and a 0.2 µm thick high concentration P-type IN0.53Ga0.47As contact layer 306. The process starts with a 1500 Å SiNx layer 307 deposition on the wafer surface by PECVD at 250° C., as shown in FIG. 3B. Through conventional mask aligning photolithography process, a 4 µm wide photoresist pattern 308 (see FIG. 3C) is defined on the SiNx surface and serves as the etching mask for subsequent etching process. The SiNx layer not underneath the resist mask is then removed by RIE using $CF_4$ gas, as shown in FIG. 3D. After removing the resist mask 308, the device structure is as shown in FIG. 3E, and the resist pattern is transferred to the SiNx layer 307. After the wafer surface has been cleaned and de-oxidized, the sample is wet etched using the patterned SiNx layer as the etching mask for ridge formation. A well mixed $H_3PO_4$: $H_2O_2$: $H_2O$ (1:1:20) solution, having an etching rate of about 0.25 µm/min, and highly selective between IN0.53Ga0.47As and InP is used to remove the high concentration P-type IN0.53Ga0.47As contact layer 306. The nearly isotropic etching inevitably causes a slightly undercut IN0.53Ga0.47As layer 306a as shown in FIG. 3F. After SiNx mask removal by HF: $H_2O$ (1:10) solution, the IN0.53Ga0.47As layer 306a (see FIG. 3G) now serves as the mask for P-type InP waveguide layer etching, which utilizes a well-mixed HCl: $H_3PO_4$(1:3) solution as an etchant. The etching rate for InP is about 0.6 µm/min and is highly selective between IN0.53Ga0.47As and InP. After InP etching, the device profile is configured as that shown in FIG. 3H. An InP layer 305a exhibits a slightly inverse-tapered profile, which is a consequence of ridge orientation parallel to the minor flat of the wafer in this embodiment. The inverse-tapered profile together with layer undercut results in a profile with wider ridge top than the semiconductor ridge top, while preserves the prescribed width for current injection into the active region (2 µm in this embodiment). After the semiconductor ridge etching, a 3000 Å SiOx passivation layer 309 is deposited on the entire wafer surface by PECVD at 250° C., as shown in FIG. 3I.

To this stage, the device is fabricated through well-known semiconductor process. In the following, the STOP technique cooperated with overall etch back process will be utilized so as to achieve the object of self-aligning.

After SiOx surface passivation, the wafer is transferred into another PECVD chamber, which allows for rapid SiOx deposition with a rate of 2750 Å/min at 350° C. to form a 3 µm thick SiOx layer 310 as shown in FIG. 3J. This thick SiOx layer covers the entire wafer surface and forms oxide ridges which stem from the underneath semiconductor ridges. By the conventional polishing process described in the previous embodiment, the oxide surface is planarized to a SiOx plane 310a shown in FIG. 3K. Then RIE polish with $CF_4$ gas is used for overall etching back of the SiOx plane until the IN0.53Ga0.47As ohmic contact layer is on the semiconductor ridge top and is uniformly exposed. To further increase the contact area of the electrode, the whole In0.53Ga0.47As contact layer 306a including its tapered side walls, in exposed, as shown in FIG. 3L. Therefore, contrary to the previous embodiment, the top of the contact layer is higher than the surrounding SiOx 310b.

As in previous embodiment, although the following processes are not directly related to this invention, the planar device structure derived from the above steps of this invention facilitates the following processes.

Figure 4:
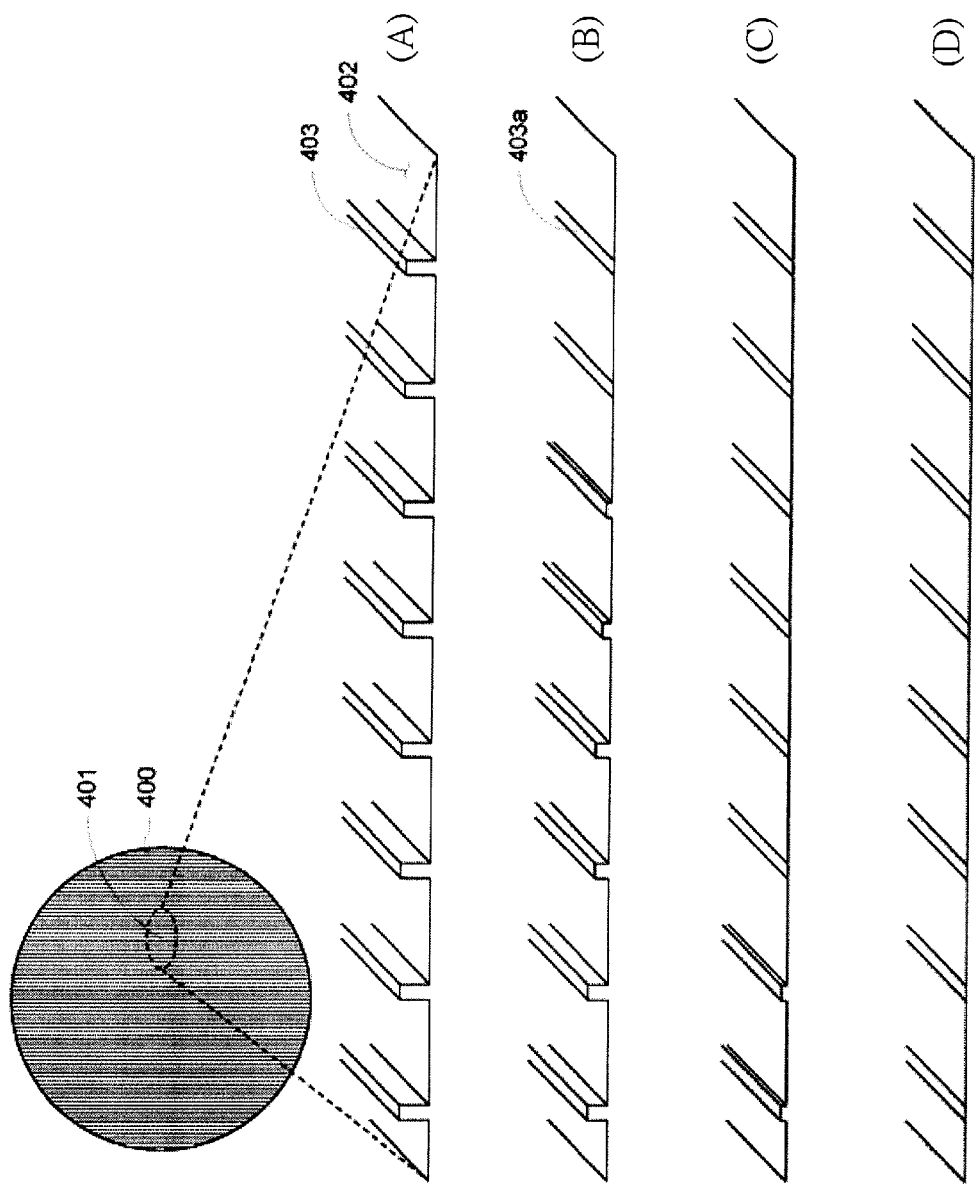
FIG. 4 is a schematic view showing how SiOx ridge-structure surface varies as the self-terminated polishing process proceeds.

After uniform exposure of the IN0.53Ga0.47As contact regions on the ridge top, the conventional photolithography process is utilized to define the P-metal region, as shown in FIG. 3M. Note that an inverse-tapered resist profile is helpful for the following metal lift-off process. 500 Å Ti, 500 Å Pt, and 4000 Å Au are then deposited onto the wafer surface successively, as shown in FIG. 3N. After metal lift-off with acetone, which dissolves a resist pattern 311 and further removes a metal 312b adhering thereto thereby accomplishing metal lift-off. A remained metal 312a in contact with the exposed In0.53Ga0.47As layer serves as a P-type metal electrode, as shown in FIG. 3O. After 20 sec RTA at 420° C. in nitrogen gas ambience for the P-metal electrode, the wafer backside is lapped and polished with the wafer thickness 300a down to about 100 $\mu$m, and 1000 Å AuGeNi alloy and 4000 Å Au are deposited onto the polished wafer backside for a N-metal electrode 313, as shown in FIG. 3P. Finally, another 20 sec RTA at 390° C. is performed for this N-type metal electrode. in both embodiments, STOP technique is utilized for planarizing corrugated SiOx surface. FIG. 4 shows how the SiOx ridge-structured surface varies as the self-terminated polishing process proceeds. A wafer 400 with corrugated SiOx surface before polishing is exhibited in (A). As in the above two embodiments, the initial height of the oxide ridges 403 is about 1.6–1.7 $\mu$m, which is far exceeding the uniformity that a conventional polishing machine can achieve (±5 $\mu$m in typical). Therefore, as shown in (B), after beginning several minutes polishing with conventional polishing tools, in a specific range 401, the height of the SiOx ridges 403a are not uniformly polished down. However, the pressure exerted on the polished surface can be adjusted so that the polishing rate for a SiOx plane 402 is so slow that it approaches nearly zero. On the contrary, due to rather small area of the SiOx ridge, the ridge height polishing rate can be comparatively much faster that reaches about 0.15 $\mu$m/mi n. Therefore, as the polishing process continues, the SiOx ridge will be completely polished down in sequence without affecting the SiOx plane 402, as shown in (C) and (D). This means that after all the SiOx ridges are planarized, the polishing rate reduces to almost zero as if self-terminated. Consequently, the planarization uniformity depends much more on the SiOx deposition process than the polishing process. Obviously the technique of the present invention is applicable for mass production that requires high processing uniformity and yield.

It emerges from the description of the above two embodiment that the invention has several noteworthy advantages over conventional techniques, in particular:

(1) Easy and reliable process: Conventional double-trench structure requires at least three steps of mask alignment process, while only two are required by this self-aligned method (i.e. ridge definition and P-metal definition). Besides, trench structure may cause metal coverage problem if the semiconductor ridge has an inappropriate cross sectional profile, such as inverse-tapered or layer undercut. Such problems may result in a large resistance along the electrical path or even cause disconnected electrical path as the metal film goes down from the ridge to the trench bottom. Large resistance produces unwanted parasitic and heating effects, while disconnected circuit leads to padless device, both cut the yield down. The planar device structure, on the contrary, is free from these problems, and since the entire top can be fully utilized. or even over-utilized, for metal contact, contact resistance can be optimized, which results in less thermal effect. Besides, by using stop technique, chemical wet etching, which is more convenient than dry etching process, is also welcome in forming the ridge structure.

(2) Best process uniformity: By applying STOP technique to planarize the ridge-structured SiOx surface, one can obtain a SiOx plane with its planarity decided by the oxide deposition process which is typically smaller than ±1% (except at wafer edge). Consequently, best process uniformity can be obtained.

(3) Potential for high-speed operation: Due to placing the metal pad on the thick SiOx layer, the parasitic capacitance generated thereby can be significantly reduced. Therefore a higher RC-limited bandwidth can be obtained.

(4) Potential for flip-chip bonding: The planar device structure facilitates a P-side-down flip-chip bonding process, which is beneficial for heat dissipation for the semiconductor laser. Besides, flip-chip bonding also enables quasi-monolithic integration between semiconductor lasers and other active/Passive optoelectronic devices.

Many changes and modifications in the above-described embodiments of the invention can, of course, be carried out without departing from the scope thereof. Accordingly, to promote the progress in science and the useful arts, the invention is disclosed and is intended to be limited only by the scope of the appended claims.

What is claimed is:

1. A self-aligned fabrication method for ridge-waveguide semiconductor laser comprising the steps of:

a) providing an epitaxially grown, multi-layered laser structure that further includes a semiconductor substrate, a first semiconductor waveguide layer, a first semiconductor confinement layer, a semiconductor active layer region, a second semiconductor confinement layer, a second semiconductor waveguide layer, and a semiconductor ohmic contact layer;

b) depositing a first dielectric layer on the entire surface of said semiconductor ohmic contact layer obtained from step a;

c) forming a semiconductor ridge structure by using patterned said first dielectric structure obtained from step b as an etching mask and performing an etching process;

d) depositing a second dielectric layer on the entire ridge-structured wafer surface obtained from step c for semiconductor surface passivation;

e) depositing a third dielectric layer on the entire surface of ridge-structured and passivated wafer surface obtained from step d;

f) performing a planarization process to planarize said third dielectric layer obtained from step e;

g) performing an overall etch-back process to uniformly reduce said planarized dielectric layer thickness until said ohmic contact layer on the semiconductor ridge top being uniformly exposed; and h) depositing a first metal layer and a second metal layer, said first metal layer being in contact with said exposed ohmic contact layer on the semiconductor ridge top obtained from step g for serving as an electrode on the wafer surface, while said second metal layer being deposited on the polished wafer back side for serving as an electrode on the wafer back side.

2. The method of claim 1, wherein said first dielectric layer formed in step a is made of SiOx, SiNx, or SiOxNy.

3. The method of claim 1, wherein said etching process for semiconductor ridge structure in step c is formed by wet etch, or dry etch, or the above combination.

4. The method of claim 1, wherein said second dielectric layer formed in step d is made of SiOx, or SiNx, or SiOxNy.

5. The method of claim 1, wherein the thickness of said third dielectric layer formed in step e is larger than its ridge height, and is made of SiOx or SiCOH.

6. The method of claim 1, wherein said planarization process performed in step f is by dielectric polishing process using a polish equipment with an adjustable load.

7. The method of claim 1, wherein said overall etching back process for said planarized dielectric surface in step g is performed by wet etch, or dry etch, or the combination.

8. The method of claim 1, further comprises a step subsequent to step c and prior to step d, removing said first dielectric layer which is used as an etching mask.

* * * * *